(12) United States Patent
Aldaz et al.

(10) Patent No.: US 8,415,656 B2
(45) Date of Patent: Apr. 9, 2013

(54) LIGHT EMITTING DEVICE WITH TRENCHES AND A TOP CONTACT

(75) Inventors: Rafael I. Aldaz, Pleasanton, CA (US); Aurelien J. F. David, San Francisco, CA (US)

(73) Assignees: Koninklijke Philips Electronics N.V., Eindhoven (NL); Philips Limileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 13/348,736

(22) Filed: Jan. 12, 2012

(65) Prior Publication Data

US 2012/0112161 A1 May 10, 2012

Related U.S. Application Data

(62) Division of application No. 12/770,550, filed on Apr. 29, 2010, now Pat. No. 8,154,042.

(51) Int. Cl.
*H01L 00/06* (2006.01)
(52) U.S. Cl.
USPC ........... 257/13; 257/99; 257/79; 257/E33.008
(58) Field of Classification Search .............. 257/13, 257/79, E33.898–E33.99, E33.066, E33.068
See application file for complete search history.

(56) References Cited

U.S. PATENT DOCUMENTS

| 5,789,768 A | 8/1998 | Lee et al. |
| 2002/0017652 A1 | 2/2002 | Illek et al. |
| 2002/0060316 A1* | 5/2002 | Matsuyama ............ 257/12 |

FOREIGN PATENT DOCUMENTS

| JP | 61121373 A | 6/1986 |
| JP | 7106631 A | 4/1995 |
| WO | 0213281 A1 | 2/2002 |
| WO | 2008112064 A2 | 9/2008 |

OTHER PUBLICATIONS

T. Gessmann et al, "Omnidirectional Reflective Contacts for Light-Emitting Diodes", IEEE Electron Device Letters, vol. 24, No. 10, Oct. 2003, pp. 683-685.
R. Windisch et al, "InGaAIP Thin Film LEDs With High Luminous Efficiency", OSRAM OPTO Semiconductors, Light-Emitting Diodes: Research, Manufacturing and Applications VIII, Proceedings of SPIE vol. 5366, pp. 43-52.

* cited by examiner

Primary Examiner — Tran Tran

(57) ABSTRACT

A device includes a semiconductor structure comprising a light emitting layer disposed between an n-type region and a p-type region. A bottom contact disposed on a bottom surface of the semiconductor structure is electrically connected to one of the n-type region and the p-type region. A top contact disposed on a top surface of the semiconductor structure is electrically connected to the other of the n-type region and the p-type region. A mirror is aligned with the top contact. The mirror includes a trench formed in the semiconductor structure and a reflective material disposed in the trench, wherein the trench extends through the light emitting layer.

8 Claims, 4 Drawing Sheets

LIGHT EMITTING DEVICE WITH TRENCHES AND A TOP CONTACT

CROSS-REFERENCE TO RELATED APPLICATIONS

This is a division of U.S. application Ser. No. 12/770,550, filed Apr. 29, 2010, by Rafael I. Aldaz et al., titled "Light Emitting Device With Trenches and a Top Contact", and incorporated herein by reference.

BACKGROUND

Description of Related Art

Light emitting diodes (LEDs) are widely accepted as light sources in many applications that require low power consumption, small size, and high reliability. Energy-efficient diodes that emit light in the yellow-green to red regions of the visible spectrum often contain active layers formed of an AlGaInP alloy. Energy-efficient diodes that emit light in the UV to blue to green regions of the visible spectrum often contain active layers formed of a III-nitride alloy.

FIG. 1 shows an AlInGaP LED structure with a removed GaAs substrate 10 with an embedded array of cone-shaped microreflectors. Truncated cones are etched through the active layer 12. Electrical contact is made by metal 18 at openings 14 in the dielectric layer 16. The structure is connected to a carrier 20 and forward biased by top electrode 22 and bottom electrode 24. Light rays 26, which are totally reflected at the metal mirror along the cones, are directed upwards toward the LED surface where they are extracted. The path length from the active layer to the top of the LED structure is only a few micrometers and does not include any absorbing material such as the active layer so that the effect of self-absorption inside the device is greatly reduced.

SUMMARY

In accordance with embodiments of the invention, a device includes a semiconductor structure comprising a light emitting layer disposed between an n-type region and a p-type region. A bottom contact disposed on a bottom surface of the semiconductor structure is electrically connected to one of the n-type region and the p-type region. A top contact disposed on a top surface of the semiconductor structure is electrically connected to the other of the n-type region and the p-type region. A mirror is aligned with the top contact. The mirror includes a trench formed in the semiconductor structure and a reflective material disposed in the trench, wherein the trench extends through the light emitting layer.

DETAILED DESCRIPTION

Depending on the context, as used herein, "AlGaInP" or "AlInGaP" may refer in particular to a quaternary alloy of aluminum, indium, gallium, and phosphorus, or in general to any binary, ternary, or quaternary alloy of aluminum, indium, gallium, and phosphorus. "III-nitride" may refer to a binary, ternary, or quaternary alloy of any group III atom (such as aluminum, indium, and gallium) and nitrogen. Depending on the context, as used herein, "contact" may refer in particular to a metal electrode, or in general to the combination of a semiconductor contact layer, a metal electrode, and any structures disposed between the semiconductor contact layer and the metal electrode.

Figure 1:
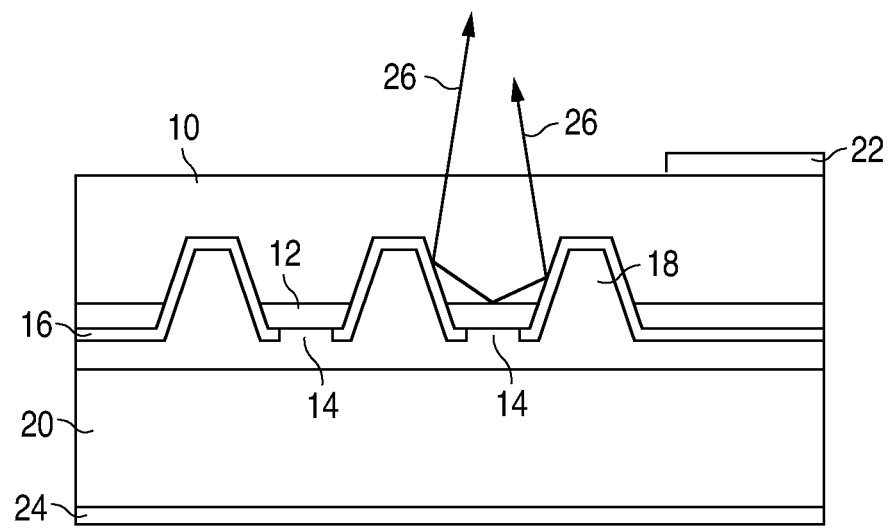
FIG. 1 illustrates a prior art AlGaInP LED device with buried reflectors.
Figure 2:
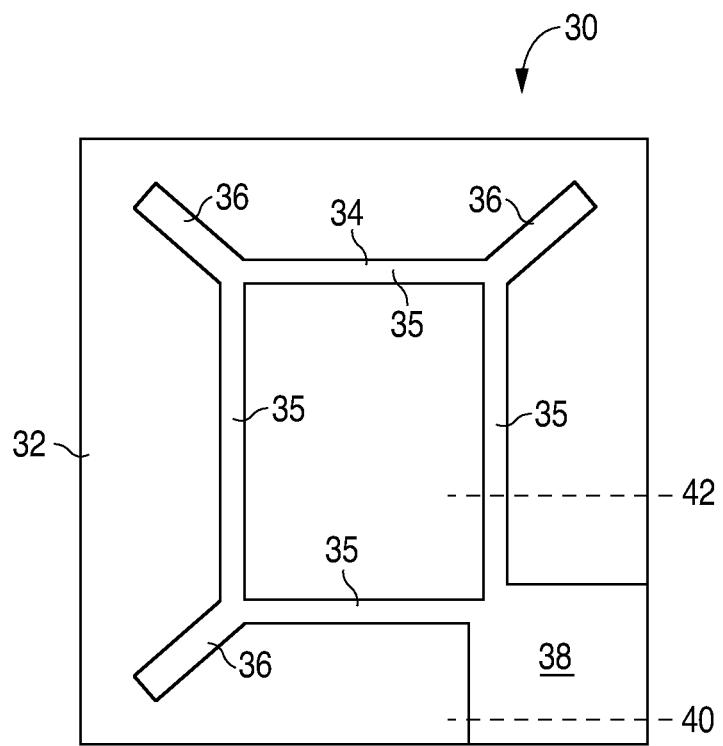
FIG. 2 is a top view of a thin film AlInGaP device according to embodiments of the invention.

FIG. 2 is a top view of an AlInGaP device 30 according to embodiments of the invention. FIG. 2 illustrates an n-contact 34 formed on the top surface 32 of an n-type region. N-contact 34 may be, for example, gold, AuGe, or any other suitable metal. The n-contact 34 may have arms 35 that form a square and extensions 36 that extend from the corners of the square, though it need not. N-contact may have any suitable shape. N-contact arms 35 and extensions 36 may be 1 to 100 microns wide in some embodiments, 1 to 30 microns wide in some embodiments, and 20 to 50 microns wide in some embodiments. The n-contact arms 35 and extensions 36 are generally kept as narrow as possible to minimize light blockage or absorption, but wide enough not to incur excessive electrical contact resistance. The contact resistance increases for widths less than the transfer length $L_t$, which depends on the metal-to-semiconductor resistance and sheet resistance of the underlying semiconductor n-type layer. The n-contact segment width may be twice $L_t$ since the contact arm injects current from both sides, or 1 to 30 microns for the above-described device, depending on the specific material parameters.

In some embodiments, the n-contact 34 is made highly reflective (R>0.8). In some embodiments, a current-spreading layer is disposed between the n-type region 50 and n-contact 34 in order to improve current spreading, and potentially to minimize the surface of the n-contact thus reducing optical losses. The current-spreading layer material is selected for low optical loss and good electrical contact. Suitable materials for the current-spreading layer include are Indium Tin Oxide, Zinc Oxide, or other transparent conducting oxides.

N-contact 34 connects to a bonding pad 38. Bonding pad 38 is large enough to accommodate a wire bond, wire bridge, or other suitable electrical contact to an external current source. Though in the device of FIG. 2 bonding pad 38 is located in the corner of the device, bonding pad 38 may be located in any suitable position, including, for example, in the center of the device.

Figure 3:
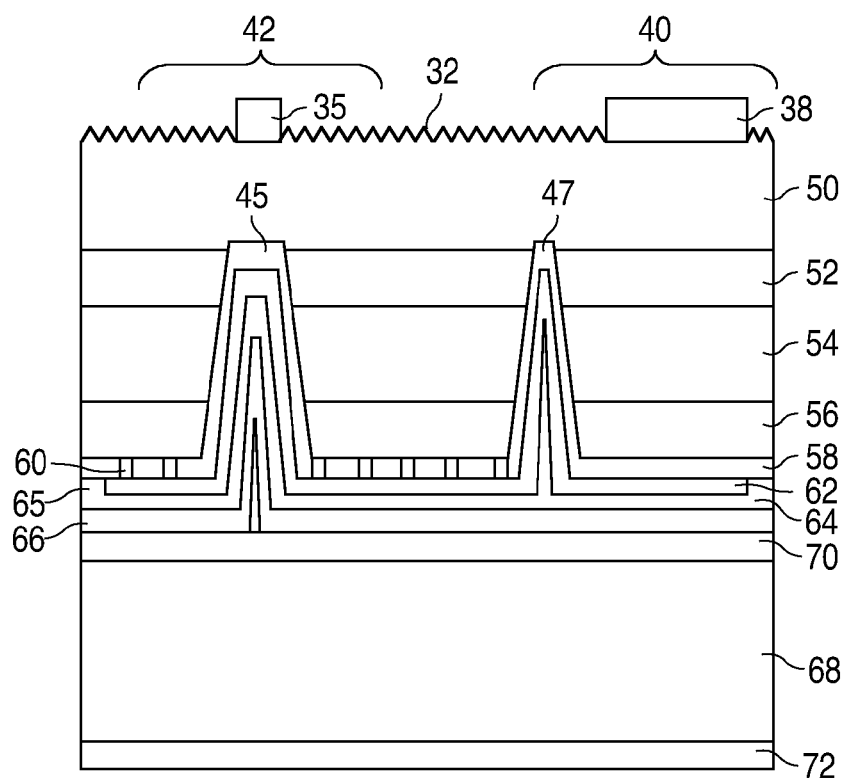
FIG. 3 illustrates cross sectional views of two regions of the device illustrated in FIG. 2.

FIG. 3 is a cross sectional view of two of the regions shown in FIG. 2. Region 40 illustrates the device under bonding pad 38. A mirror 47 embedded in the semiconductor structure optically isolates the region beneath bonding pad 38. No light is generated in the active region 52 beneath bonding pad 38 because dielectric layer 58 prevents current from being injected from p-metal 68 into p-type contact layer 56 in the area directly beneath bonding pad 38. Light emitted in other parts of the active region in the direction of bonding pad 38 is reflected by mirror 47 away from bonding pad 38 preventing light from being absorbed by bonding pad 38 or the dark active region 52 beneath bonding pad 38. In some embodiments, the sides of mirror 47 are sloped to direct light out the top surface of the device. Since the electrons injected from bonding pad 38 cannot recombine with holes in active region 52 beneath bonding pad 38, the electrons are forced to travel laterally outside region 40 to recombine in a more optically favorable region of the device. This technique avoids the typical current crowding effect underneath large bonding pad areas and redistributes current to the areas designed for optical extraction.

Region 42 illustrates the device under n-contact arm 35. A mirror 45 embedded in the semiconductor structure prevents light from being generated underneath or absorbed by re-contact arm 35 in region 42. In some embodiments, embedded mirrors are positioned under all or substantially all of the n-contact structure 34, to reduce the amount of light that is absorbed by n-contact 34. Embedded mirrors are formed in trenches in the semiconductor device, which may be etched through active region 52. The trenches may be aligned with and have the same width as n-contact arms 35 and extensions 36. Light emitted in the direction of n-contact arm 35 is reflected by mirror 45 away from n-contact arm 35. In some embodiments, the sides of mirror 45 are sloped to direct light out the top surface of the device.

Mirrors 45 and 47 include a reflective conductive layer 62 (often a reflective metal layer such as silver or aluminum) and a dielectric layer 58. The dielectric layer is positioned between the semiconductor structure and the reflective conductive layer 62 and also provides electrical isolation in some embodiments. Light incident on the mirror at large angles is totally internally reflected by dielectric layer 58. Light incident on the mirror at small angles passes through the dielectric layer and is reflected by reflective layer 62.

Figure 4:
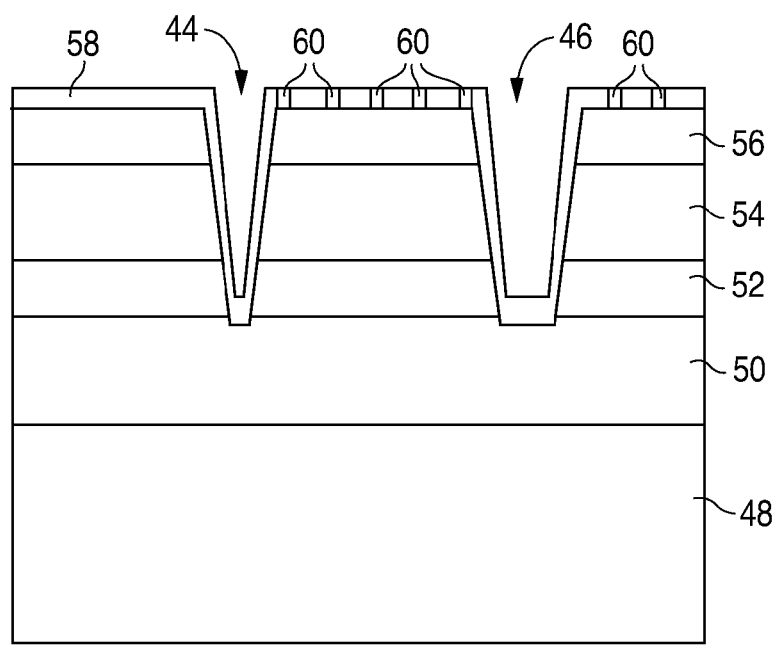
FIG. 4 illustrates a portion of a semiconductor structure with trenches and p-contacts formed on the p-type region.
Figure 5:
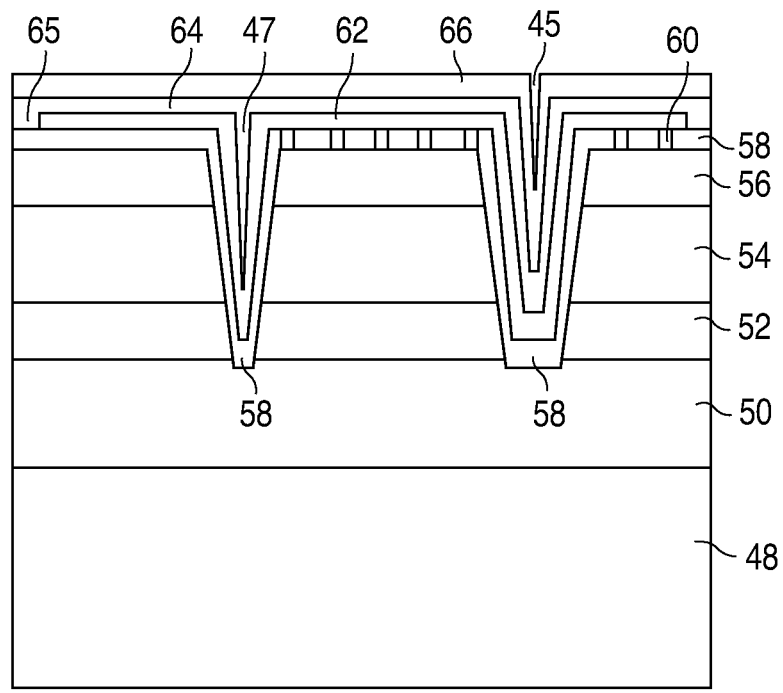
FIG. 5 illustrates the structure of FIG. 4 after forming a reflective p-contact, a guard metal, and a bonding layer.
Figure 6:
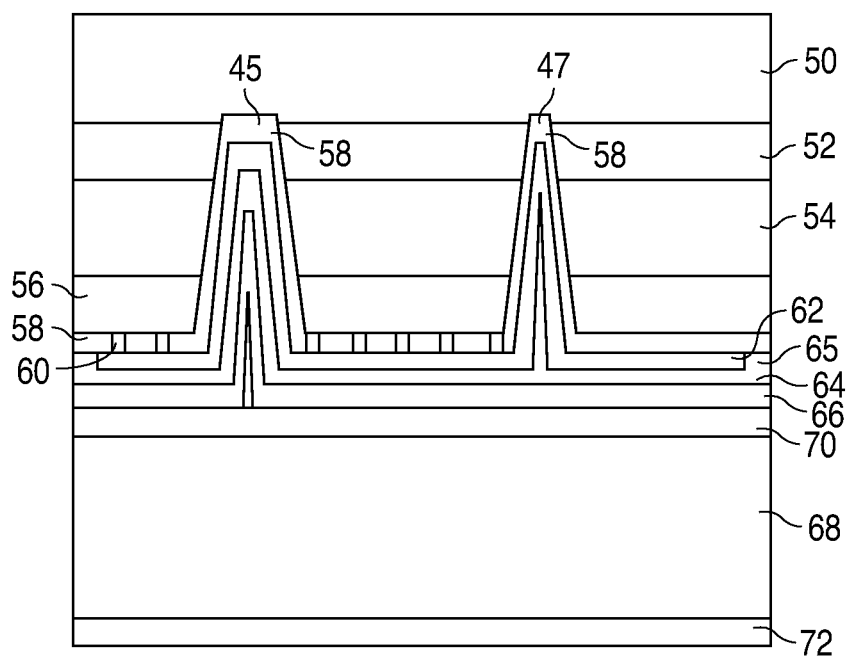
FIG. 6 illustrates the structure of FIG. 5 after bonding to a mount and removing the growth substrate.

The device illustrated in FIGS. 2 and 3 may be formed as illustrated in FIGS. 4-6. In FIG. 4, a semiconductor device structure is grown over a growth substrate 48. Growth substrate 48 is often GaAs, though any suitable growth substrate may be used. An etch stop layer (not shown) is grown over substrate 48. The etch stop layer may be any material that may be used to stop an etch used to later remove substrate 48. The etch stop layer may be, for example, InGaP, AlGaAs, or AlGaInP. The material of the etch stop layer may be lattice-matched to the growth substrate (typically GaAs), though it need not be. Etch stop layers that are not lattice matched to the growth substrate may be thin enough to avoid relaxation and/or may be strain compensated. The thickness of the etch stop layer depends on the selectivity of the etch solutions used to remove the GaAs substrate; the less selective the etch, the thicker the etch stop layer. An AlGaAs etch stop layer may be, for example, between 2000 and 5000 Å, though a thicker etch stop layer may be used if the etch stop layer is used to texture the emitting surface of the device, as described below. The composition x of an $Al_xGa_{1-x}As$ etch stop layer may be, for example, between 0.50 and 0.95.

The device layers, including at least one light emitting layer in a light emitting region sandwiched between an n-type region and a p-type region, are grown over the etch stop layer, starting with n-type region 50. The thickness and doping concentration of n-type region 50 are selected for low electrical resistance and good current distribution. For example, n-type region 50 may include an AlGaInP layer 4 to 10 μm thick and doped with Te or Si to a concentration of about $1\times10^{18}$ cm$^{-3}$. An AlGaInP n-type region 50 is usually lattice-matched to GaAs. At higher dopant concentrations, the same current distribution may be achievable with a thinner layer; however, undesirable free carrier absorption may increase at higher dopant concentrations. N-type region 50 may therefore include a non-uniform doping concentration, such as one or more thick regions doped at $1\times10^{18}$ cm$^{-3}$, and one or more thin regions that are doped more heavily, up to, for example, $1\times10^{19}$ cm$^{-3}$. These highly doped regions may be doped with Te, Si, S, or other suitable dopants, and the high doping concentration can be achieved either by epitaxial growth, by dopant diffusion, or both. In one example, the composition of n-type region 50 in a device with a light emitting region configured to emit red light is $(Al_{0.40}Ga_{0.60})_{0.5}In_{0.5}P$.

A light emitting or active region 52 is grown over n-type region 50. Examples of suitable light emitting regions include a single light emitting layer, and a multiple well light emitting region, in which multiple thick or thin light emitting wells are separated by barrier layers. In one example, the light emitting region 52 of a device configured to emit red light includes $(Al_{0.06}Ga_{0.94})_{0.5}In_{0.5}P$ light emitting layers separated by $(Al_{0.65}Ga_{0.35})_{0.5}In_{0.5}P$ barriers. The light emitting layers and the barriers may each have a thickness between, for example, 20 and 200 Å. The total thickness of the light emitting region may be, for example, between 500 Å and 3 μm.

A p-type region 54 is grown over light emitting region 52. P-type region 54 is configured to confine carriers in light emitting region 52. In one example, p-type region 54 is $(Al_{0.65}Ga_{0.35})_{0.5}In_{0.5}P$ and includes a thin layer of high Al composition to confine electrons. The thickness of p-type region 54 may be on the order of microns; for example, between 0.5 and 3 μm. The proximity of the light emitting layers of the light emitting region to the p-contact through a thin p-type region 54 may also reduce the thermal impedance of the device.

A p-type contact layer 56 is grown over p-type region 54. P-type contact layer 56 may be highly doped and transparent to light emitted by the light emitting region 52. For example, p-type contact layer 56 may be doped to a hole concentration of at least $5\times10^{18}$ cm$^{-3}$ in some embodiments, and at least $1\times10^{19}$ cm$^{-3}$ in some embodiments. In this case, p-type contact layer 56 may have a thickness between 100 Å and 1000 Å. If the p-type contact layer 56 is not highly doped then the thickness may be increased to as much as 2 μm.

In some embodiments, p-type contact layer 56 is highly doped GaP. For example, a GaP contact layer 56 grown by metal organic chemical vapor deposition may be doped with Mg or Zn, activated to a hole concentration of at least $8\times10^{18}$ cm$^{-3}$. The GaP layer may be grown at low growth temperature and low growth rate; for example, at growth temperatures approximately 50 to 200° C. below typical GaP growth temperatures of ~850° C., and at growth rates of approximately 1% to 10% of typical GaP growth rates of ~5 μm/hr. A GaP contact grown by molecular beam epitaxy may be doped with C to a concentration of at least $1\times10^{19}$ cm$^{-3}$.

As an alternative to incorporating dopants during growth, the p-type contact layer 56 may be grown, then the dopants may be diffused into the p-type contact layer from a vapor source after growth, for example by providing a high pressure dopant source in a diffusion furnace or in the growth reactor, as is known in the art. Dopants may be diffused from a vapor source into the entire area of the surface of p-type contact layer 56, or in discrete regions of p-type contact layer 56, for example by masking parts of p-type contact layer 56 with, for example, a dielectric layer, prior to dopant diffusion.

In some embodiments, p-type contact layer 56 is a highly doped GaP or lattice-matched AlGaInP layer. The layer is doped by growing the semiconductor material, then depositing a layer, including a dopant source, over the grown layer. For example, the dopant source layer may be elemental Zn, a AuZn alloy, or a doped dielectric layer. The layer including the dopant source may optionally be capped with a diffusion blocking layer. The structure is annealed such that the dopants diffuse into the semiconductor from the dopant source layer. The diffusion blocking layer and remaining dopant source layer may then be stripped off In one example, 3000 Å to 5000 Å of a AuZn alloy containing 4% Zn is deposited over a GaP layer, followed by a TiW diffusion blocking layer. The structure is heated, then the remaining TiW and AuZn are stripped. In another example, the patterned AuZn layer is left in place as the contact metal 60 shown in, for example, FIG. 4.

In some embodiments, p-type contact layer 56 is highly doped InGaP or AlGaInP layer that is not lattice-matched to GaAs. The layer may be between 100 Å and 300 Å thick and doped with Mg or Zn to a hole concentration of at least $1 \times 10^{19}$ $cm^{-3}$.

After growth of the device layers, trenches 44 and 46 are etched into the semiconductor structure. In some embodiments, trenches 44 and 46 extend through the p-type layers 54 and 56 and through active region 52. In some embodiments, trenches 44 and 46 extend into n-type region 50. Deeper trenches form more effective mirrors; however, the depth of trenches 44 and 46 is limited by the need to spread current through n-type region 50 and to maintain the structural integrity of the semiconductor structure during processing and operation. The width at the bottom of trench 46, which forms the mirror under n-contact arm 35, may be the same as the width of n-contact arm 35 to guarantee removal of the active region directly underneath the n-contact arm. Trench 44, which forms the mirror that reflects light away from bonding pad 38, may be narrower at the bottom than trench 46. In various embodiments, trenches 44 and 46 may have angled or straight sidewalls. Sidewalls are angled 30° to 60° relative to a normal to the top surface of the semiconductor structure in some embodiments and 45° relative to a normal to the top surface of the semiconductor structure in some embodiments. Angled sidewalls may be formed, for example, by heating a photoresist mask such that it reflows to form a sloped sidewall. The shape of the sloped sidewall is transferred to the semiconductor by dry-etching.

Trenches 44 and 46 and the top surface of p-type contact layer 56 are lined with a dielectric material 58 such as $SiO_2$ formed by, for example, plasma-enhanced chemical vapor deposition. Dielectric material 58 may be a single layer of material or multiple layers of the same or different materials. In some embodiments, the thickness of dielectric layer 58 is sufficient to ensure total internal reflection and avoid optical losses due to the underlying reflective layer 62. The minimum necessary thickness for this effect is a fraction of an optical wavelength, and depends on the refractive index of the dielectric. For instance with a $SiO_2$ dielectric layer 58, a thickness of at least 50 nm would be suitable, and a thickness as large as one or several microns could be used.

Small holes are etched in dielectric layer 58 where electrical contact to p-type contact layer 56 is desired. No openings are formed in the dielectric layer 58 below bonding pad 38. The holes are then filled with a contact metal 60. The contact metal 60 may be formed by, for example, sputtering of AuZn and a lift-off process. The etching of the small holes on dielectric 58 and lift-off of metal contact 60 might may be performed with a single photoresist mask resulting in a self-aligned processes. In some embodiments, the small holes on dielectric 58 filled with contact metal 60 are between 1 μm and 10 μm in diameter with a total coverage percentage between 1% to 10% of the top surface of the p-type contact layer.

In FIG. 5, the reflective layer 62 is formed over dielectric layer 58 and contacts 60. Reflective layer 62 lines the trenches. Reflective layer 62 may be, for example, silver, and may be deposited by, for example, evaporation or sputtering. Reflective layer 62 may be a single layer of material or multiple layers of the same or different materials. In some embodiments the thickness of reflective layer 62 is between 1000 Å and 5000 Å. The reflective layer 62 is electrically conductive and therefore makes electrical contact with contact metal 60 in the regions where contact metal 60 is formed.

A layer of photoresist is deposited over reflective layer 62 and patterned, then the reflective layer is removed from the edges of the device. A layer of guard material, for example TiW, is formed over the photoresist and the edges of the device, for example, by sputtering, then the photoresist is removed, leaving the guard material 65 next to the reflective layer 62 at the edges of the device. (Guard material 65 is formed at the edges of the device, not necessarily in the areas illustrated in FIGS. 3-7.) Another layer of guard material 64 is formed over the surface of the reflective layer 62 exposed by removing the photoresist. The guard material 65 at the edges of reflective layer 62 and the guard material 64 over the top of reflective layer 62 seal the reflective layer in place, which may reduce or prevent problems such as electromigration or oxidation of a silver reflective layer 62. Guard layers 65 and 64 may be single layers of material or multiple layers of the same or different materials. Guard layers 65 and 64 are electrically conductive in some embodiments.

A bonding layer 66 is formed over guard layer 64. Bonding layer 66 may be, for example, Au or TiAu and may be formed by, for example, evaporation. Bonding layer 66 may be a single layer of material or multiple layers of the same or different materials. As illustrated in FIG. 5, dielectric layer 58, reflective layer 62, guard layer 64, and bonding layer 66 each coat the sidewalls and bottom of trenches 44 and 46. These layers fill or almost completely fill trenches 44 and 46, which supports the device during processing (such as during growth substrate removal) and during operation. After forming these layers, any opening remaining in trenches 44 and 46 may be less than 5 microns wide in some embodiments and less than two microns wide in some embodiments. The dielectric layer 58 and reflective layer 62 form mirrors 45 and 47.

In FIG. 6, the device is bonded to a mount 68 through bonding layer 66 and a bonding layer 70 formed on mount 68. Mount 68 may be selected to have a coefficient of thermal expansion (CTE) that is reasonably closely matched to the CTE of the semiconductor layers. Mount 68 may be, for example, GaAs, Si, a metal such as molybdenum, or any other suitable material. Bonding layer 70 may be, for example, Au or any other suitable material. A bond is formed between bonding layers 66 and 70 by, for example, thermocompression bonding, or any other suitable technique. Electrical contact to the p-type region is made, for example, through a contact 72 on the bottom of mount 68. Mount 68 may be conductive or may include a conductive region or trace that electrically connects contact 72 to p-contacts 60 through reflective conductive layer 62, guard layer 64, and bonding layers 66 and 70. Alternatively, a thick mount can be grown on the device wafer by, for example, electroplating techniques.

Growth substrate 48 is removed by a technique suitable to the growth substrate material. For example, a GaAs growth substrate may be removed by a wet etch that terminates on an etch-stop layer grown over the growth substrate before the device layers. The semiconductor structure may optionally be thinned. N-contact metal, such as, for example, Au/Ge/Au or any other suitable contact metal or metals, may be deposited then patterned to form n-contact 34 and bonding pad 38. The structure may be heated, for example to anneal n-contact 34 and/or p-contacts 60. The surface 32 of n-type region 50 exposed by removing the growth substrate may be roughened to improve light extraction, for example by photoelectrochemical etching, or patterned by, for example, nanoimprint lithography to form a photonic crystal or other light scattering structure. In other embodiments, a light-extracting feature is buried in the structure. The light extracting feature may be, for example, a variation in index of refraction in a direction parallel to the top surface of the device (i.e. perpendicular to the growth direction of the semiconductor layers). In some embodiments, the surface of the p-type contact layer may be roughened or patterned prior to forming dielectric layer 58. In some embodiments, before or during growth of the semiconductor structure, a layer of low index of material is deposited on the growth substrate or on a semiconductor layer and patterned to form openings in the low index material or posts of low index material. Semiconductor material is then grown over the patterned low index layer to form a variation in index of refraction that is disposed within the semiconductor structure.

A wafer of devices may then be tested and laser-singulated into individual devices. Individual devices may be placed in packages, and an electric contact such as a wire bond may be formed on the bonding pad 38 of the device to connect the n-contact to a part of the package such as a lead.

Figure 7:
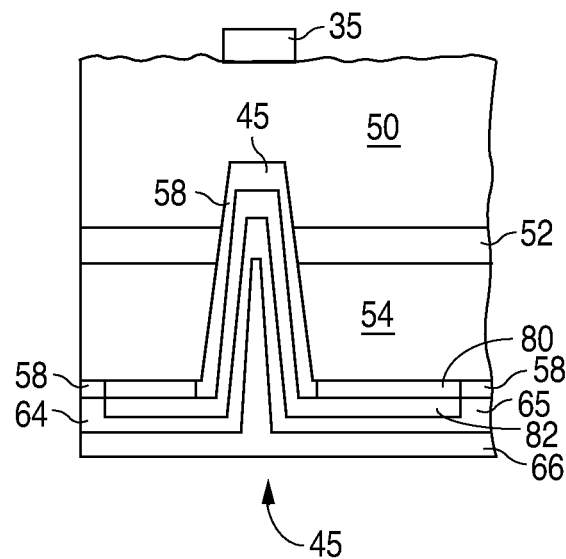
FIG. 7 illustrates a portion of a III-nitride device including a mirror aligned with a top contact.

A similar structure may be applied to a III-nitride device with a similar process. FIG. 7 illustrates a portion of a III-nitride device including a mirror 45 disposed beneath a top n-contact 35. In a III-nitride device, the p-contact metal 80 is often silver, which is reflective, unlike the p-contact metal of an AlInGaP device (contact metal 60 of FIG. 3), which is often absorbing. Accordingly, the area occupied by contact metal 60 in FIG. 3 is limited. In contrast, in FIG. 7, the area occupied by p-contact metal 80 is as large as possible. The openings made in dielectric 58 are much larger in FIG. 7 than in FIG. 3. Contact metal 80 is deposited in the openings by the same method described above. A reflective metal layer 82 is formed over contact metal 80 and dielectric 58. In some embodiments, both contact metal 80 and reflective metal 82 are silver. The reflective metal is sealed by guard material 65 at the edges and guard material 64 over the top of reflective metal 82, as described above. A bonding layer 66 is formed. Mount 68, bonding layer 70, and contact 72 are not shown in FIG. 7.

Figure 8:
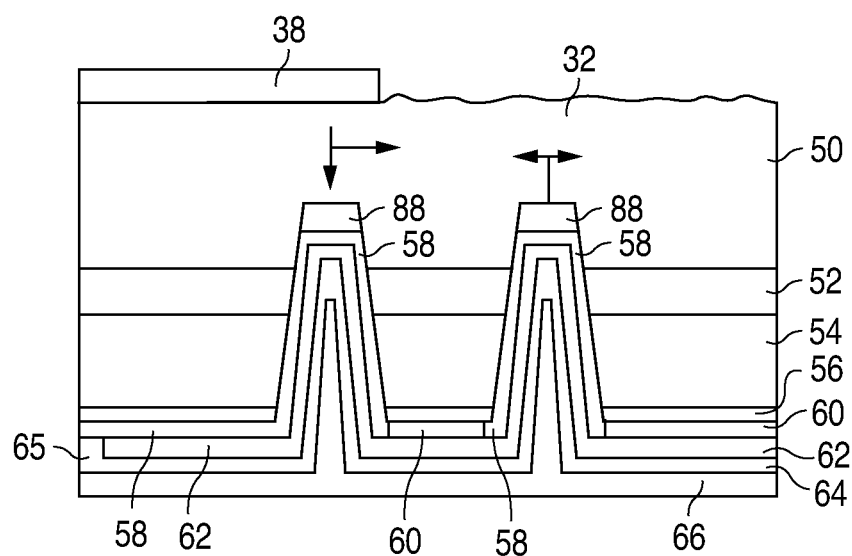
FIG. 8 illustrates a device with a top contact that injects current into mirrors.

In some embodiments, the mirrors are electrically connected to the n-type region, as illustrated in FIG. 8. In the device of FIG. 8, a conductive material 88 such as AuGe in the case of an AlInGaP device or Ag or Al in the case of a III-nitride device is disposed in the bottom of the trenches (the top of the mirrors in the orientation illustrated in FIG. 8) in electrical contact with n-type region 50. Conductive material 88 is electrically isolated from the p-type region 54 and 56 by dielectric layer 58. Conductive material 88 is completely encapsulated by n-type region 50 and dielectric layer 58. The only electrical path from conductive material 88 to an external contact such as bonding pad 38 is through the semiconductor structure. P-contacts 60 are formed as illustrated in FIGS. 3 and 4 for an AlInGaP device and as illustrated in FIG. 7 for a III-nitride device. Reflective layer 62, guard layers 64 and 65, and bonding layer 66 are formed as described above. The structure may be connected to a mount as described above.

In operation, current is injected in the p-type region by contact 60 via the mount. Current is injected in the n-type region by bonding pad 38, on the top surface of the device. As illustrated by the arrows in FIG. 8, current is injected from bonding pad 38 to conductive material 88. The two mirrors shown in FIG. 8 are formed in a continuous trench. The two conductive regions 88 are therefore interconnected, such that current spreads through conductive regions 88 and is injected into n-type region 50 from conductive regions 88. A top n-contact 34 as described above may optionally be combined with the conductive regions 88, or current may be supplied to the top surface of n-type region 50 only through bonding pad 38.

The devices illustrated in FIGS. 2, 3, 7, and 8 are thin film devices, meaning that the growth substrate is removed from the final device. The total thickness between the top contact and the top surface of the bonding layers that connect the device to the mount in the thin film devices described above is no more than 20 microns in some embodiments and no more than 15 microns in some embodiments.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
   a semiconductor structure comprising a light emitting layer disposed between an n-type region and a p-type region;
   a bottom contact disposed on a bottom surface of the semiconductor structure, wherein the bottom contact is electrically connected to one of the n-type region and the p-type region;
   a top contact disposed on a top surface of the semiconductor structure, wherein the top contact is electrically connected to the other of the n-type region and the p-type region;
   a trench formed in the semiconductor structure, wherein the trench extends through the light emitting layer;
   a conductive material disposed in a bottom of the trench; and
   a dielectric layer disposed on the conductive material, wherein the semiconductor structure and the dielectric layer completely encapsulate the conductive material.

2. The device of claim 1 further comprising a reflective material disposed in the trench, wherein the reflective material is electrically isolated from the conductive material by the dielectric layer.

3. The device of claim 1 further comprising a variation in index of refraction in a direction parallel to a top surface of the semiconductor structure, wherein the variation in index of refraction is disposed within the semiconductor structure or on a surface of the semiconductor structure.

4. The device of claim 1 wherein the trench is aligned with at least a portion of an edge of the top contact.

5. The device of claim 4 wherein in an area adjacent to a portion of the trench that is aligned with at least a portion of an edge of the top contact, an insulating layer is disposed between the bottom contact and the light emitting layer such that no current is injected in a portion of the light emitting layer beneath the top contact.

6. The device of claim 1 wherein the trench surrounds the top contact.

7. The device of claim 1 wherein the light emitting layer is a III-nitride material.

8. The device of claim 1 wherein the light emitting layer is AlInGaP.

* * * * *